(12) United States Patent
Barina et al.

(10) Patent No.: US 8,336,199 B2
(45) Date of Patent: Dec. 25, 2012

(54) TOOL FOR INSTALLATION AND REMOVAL OF SEMICONDUCTOR DEVICE

(75) Inventors: Richard M. Barina, Sebring, FL (US); James R. Drake, Research Triangle Park, NC (US); Daniel P. Kelaher, Holly Springs, NC (US); George M. Moorefield, II, Research Triangle Park, NC (US); Derek I. Schmidt, Research Triangle Park, NC (US); James S. Womble, Research Triangle Park, NC (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 12/728,096

(22) Filed: Mar. 19, 2010

(65) Prior Publication Data

US 2011/0225819 A1    Sep. 22, 2011

(51) Int. Cl.
*B23P 19/00*    (2006.01)
(52) U.S. Cl. ............... 29/764; 29/741; 29/758; 29/762
(58) Field of Classification Search .............. 29/764, 29/718, 741, 762, 758, 832; 324/750.25, 324/756.02, 757.04, 762.02
See application file for complete search history.

(56) References Cited

U.S. PATENT DOCUMENTS

| | | | |
|---|---|---|---|
| 3,516,142 A | 6/1970 | DeRose et al. | 29/203 |
| 4,392,301 A | 7/1983 | Hannes et al. | 29/741 |
| 4,507,861 A | 4/1985 | Spenkle | 29/741 |
| 4,583,287 A | 4/1986 | McDevitt et al. | 29/741 |
| 4,615,110 A | 10/1986 | Crone | 29/741 |
| 4,866,838 A | 9/1989 | Porter | 29/741 |
| 4,868,975 A | 9/1989 | Zaremba et al. | 29/741 |
| 4,984,355 A | 1/1991 | Lubrano et al. | 29/741 |
| 5,193,269 A | 3/1993 | Dattilo | 29/764 |
| 5,230,143 A | 7/1993 | Karlovich | 29/764 |
| 5,365,653 A | 11/1994 | Padrun | 29/741 |
| 5,502,887 A | 4/1996 | Gonzales | 29/764 |
| 5,842,261 A | 12/1998 | Ortiz | 29/426.5 |
| 6,982,551 B2 * | 1/2006 | Yates | 324/756.02 |
| 7,567,075 B2 * | 7/2009 | Kostuchowski et al. | 324/750.25 |

OTHER PUBLICATIONS

"Module Extractor", IBM Technical Disclosure Bulletin, vol. 28, No. 9 Feb. 1, 1986, pp. 3823-3824.

* cited by examiner

*Primary Examiner* — Thiem Phan
(74) *Attorney, Agent, or Firm* — Zilka-Kotab, PC

(57) ABSTRACT

A tool according to one embodiment includes an actuating mechanism including a cam plate; at least one gripper member operatively coupled to the cam plate; and a carriage for supporting the at least one gripper member, wherein the at least one gripper member is actuatable by the cam plate, wherein rotation of the cam plate causes the at least one gripper member to move between a first position and a second position, wherein when the at least one gripper member is in the first position, the tool is able to accept a processor for holding thereof, and wherein when the at least one gripper member is in the second position, the tool securely holds the processor therein. Additional systems and methods are also presented.

12 Claims, 12 Drawing Sheets

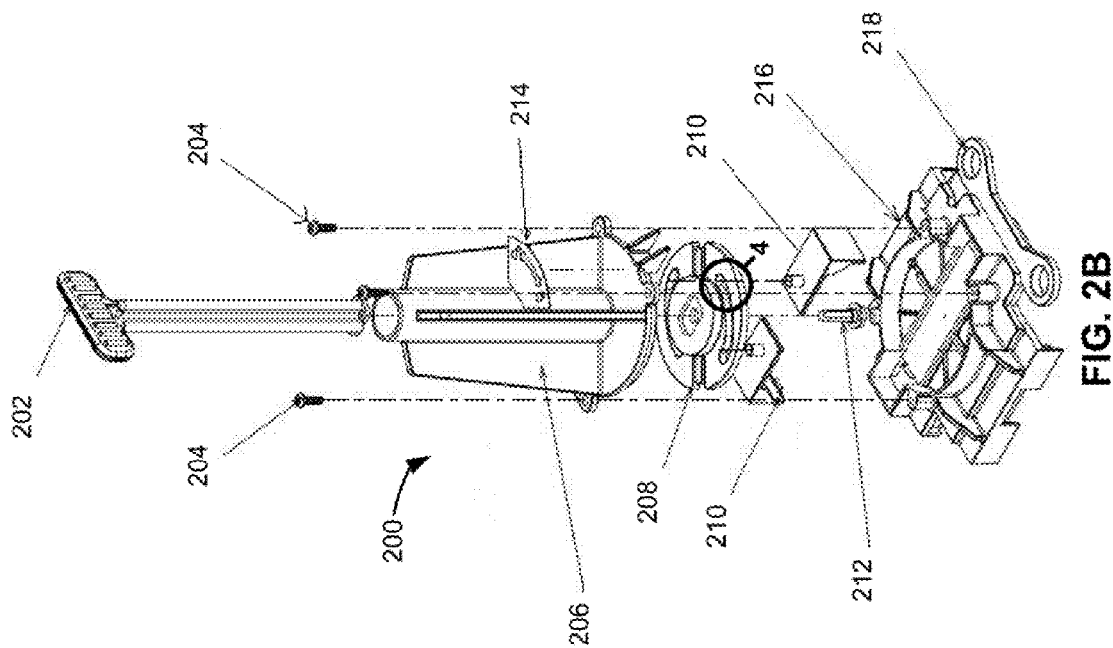
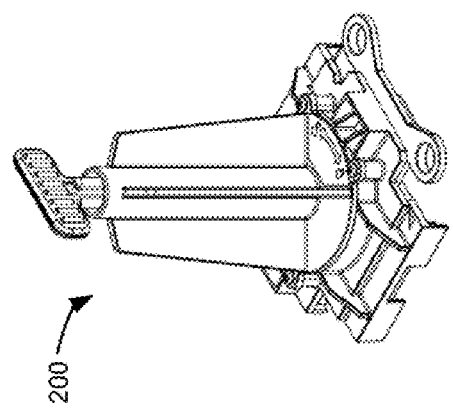
FIG. 2B
FIG. 2A

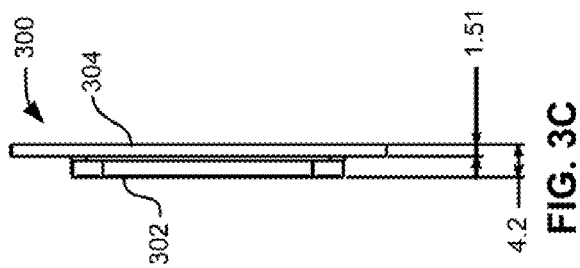
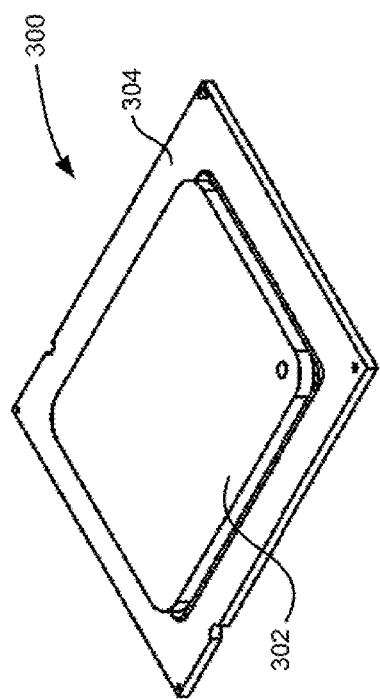
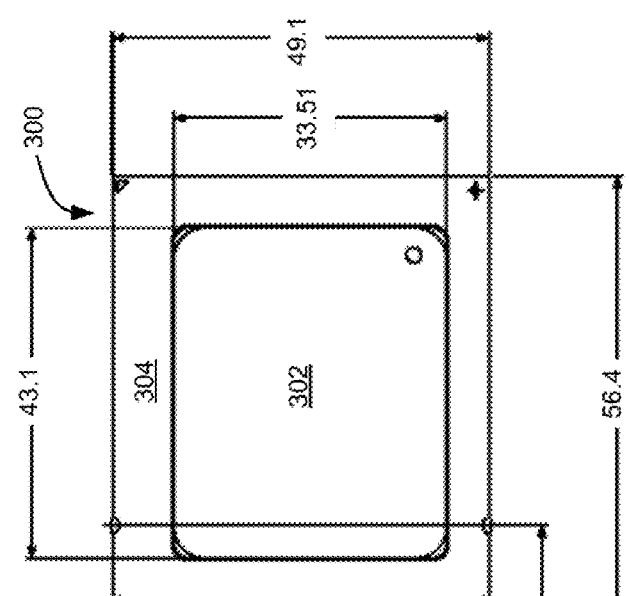

TOOL FOR INSTALLATION AND REMOVAL OF SEMICONDUCTOR DEVICE

BACKGROUND

Since processors, and especially microprocessors, are the heart of computers, they may have dozens, hundreds, or even thousands of electrical contacts, which makes it quite difficult to properly install and remove these processors. Frequently, damage occurs to the contact pins on the processor, either on the underside of the processor in the case of Pin Grid Array (PGA) processors, or on the system board, in the case of Land Grid Array processors (LGA). High costs are associated with testing, diagnosing, and replacing damaged processors, and even higher costs are associated with testing, diagnosing, and replacing circuit boards with damaged LGA sockets. Therefore, handling of these processors is a concern from manufacturing, servicing, and upgrading perspectives and invokes serious warranty considerations when damage occurs.

In order to offset the high costs of correcting the problems associated with damaged processors and/or circuit boards, installation tools have been developed which help with proper placement and installation/removal of processors, which have resulted in varying levels of effectiveness.

Referring to FIGS. 1A-1C, some processor placement tools are described, according to the prior art. In FIG. 1A, a basic suction/vacuum tool 110 is shown, which are presently available that can lift and release parts, like processors, for removal and installation. However, while these tools are versatile and may be used for many different application beyond processor placement and removal, they also have serious drawbacks when being used for processors, particularly that they do not provide a proper orientation of the processor with the socket. By not including alignment guides that enable the proper orientation of the processor into the accompanying socket, these tools do not mitigate the issues of socket or processor damage, and only address a fundamental issue of gripping the processor and securely holding the processor during motion, such as when moving from a workstation to a circuit board for placement.

Some other tools rely on the deformability of plastic to hold a processor. Referring to FIG. 1B, one such tool 120 is shown which allows for the processor to be pushed into a plastic holder by passing the processor beyond a deformable plastic guard, which deforms as the processor passes and then holds the processor in place in the tool. In order to release the processor, the user must push down on the top of the tool, which in turn deforms and spreads the deformable plastic holder and releases the processor, such as for placing the processor into the socket. This design is not without risks, some of which include the installer's actions in pushing the tool into the socket to place and remove the processor. If the tool is not properly aligned with the socket during placement and/or removal of the processor, there is a significant risk of socket and/or processor damage.

Referring to FIG. 1C, another tool design 130 is shown which uses a "tweezer" design, which includes levers that both grip the processor and are actuated to release the processor once gripped. The levers are pressed by a user on one side to release the processor from the tool, and on the other side, the tips of the levers are used as the lift points for the processor. This design inherently causes a high risk of accidental activation of the levers during handling which would release the processor from the grip of the tool, resulting in the processor accidentally falling from the tool and sustaining damage when contacting a surface, such as a workstation, floor, etc.

In addition, none of the presently-used designs allow for pickup of the processor from a socket (for processor removal/installation) or from a carrier commonly used to hold multiple processors in manufacturing plants.

Therefore, what is needed in the industry to reduce the costs associated with processor and/or socket damage is a processor handling tool that securely holds a processor in place, reduces the chance of accidental release of the processor from the tool, can be used to both remove and install processors into and out of a socket, and can be used to remove processors from a processor carrier commonly used in manufacturing plants. Other desirable features include properly positioning the tool, and thus the processor, for proper placement into/out of a socket, and installing or removing a processor from a socket without disturbing a thermal interface material on the greased surface of an already installed processor.

SUMMARY

A tool according to one embodiment includes an actuating mechanism including a cam plate; at least one gripper member operatively coupled to the cam plate; and a carriage for supporting the at least one gripper member, wherein the at least one gripper member is actuatable by the cam plate, wherein rotation of the cam plate causes the at least one gripper member to move between a first position and a second position, wherein when the at least one gripper member is in the first position, the tool is able to accept a processor for holding thereof, and wherein when the at least one gripper member is in the second position, the tool securely holds the processor therein.

A method for lifting a processor according to one embodiment includes aligning a tool with a processor using at least one alignment guide; and operating an actuating mechanism of the tool to lift the processor by rotating a cam plate of the tool, wherein the tool comprises: the actuating mechanism including the cam plate; at least one gripper member operatively coupled to the cam plate; and a carriage for supporting the at least one gripper member, wherein the carriage includes the at least one alignment guide, wherein the at least one gripper member is actuatable by the cam plate, wherein rotation of the cam plate causes the at least one gripper member to move between a first position and a second position, wherein when the at least one gripper member is in the first position, the tool is able to accept a processor for holding thereof, and wherein when the at least one gripper member is in the second position, the tool securely holds the processor therein.

A method for placing a processor according to another embodiment includes aligning a tool above a desired placement position using at least one alignment guide, the tool gripping a processor; descending the tool to the desired placement position; and operating an actuating mechanism of the tool to release the processor by rotating a cam plate of the tool, wherein the tool comprises: the actuating mechanism including the cam plate; at least one gripper member operatively coupled to the cam plate; and a carriage for supporting the at least one gripper member, wherein the carriage includes the at least one alignment guide, wherein the at least one gripper member is actuatable by the cam plate, wherein rotation of the cam plate causes the at least one gripper member to move between a first position and a second position, wherein when the at least one gripper member is in the first position, the tool is able to accept a processor for holding thereof, and wherein when the at least one gripper member is in the second position, the tool securely holds the processor therein.

A system according to one embodiment includes a processor; and a tool holding the processor in a carriage, the tool comprising: an actuating mechanism including a handle operatively coupled to a cam plate; at least one gripper member operatively coupled to the cam plate; and the carriage for supporting the at least one gripper member, wherein the carriage includes at least one alignment guide for aligning the carriage to a socket, wherein the at least one gripper member is actuatable by the cam plate, wherein rotation of the cam plate causes the at least one gripper member to move between a first position and a second position, wherein when the at least one gripper member is in the first position, the tool releases the processor, and wherein when the at least one gripper member is in the second position, the tool securely holds the processor therein.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 2A is a schematic diagram of a tool, according to one embodiment.

FIG. 2B is an exploded view of the tool, according to one embodiment.

FIG. 3A shows an isometric view of a processor for use with an LS socket, according to one embodiment.

FIG. 3B shows a top view of a processor for use with an LS socket, according to one embodiment.

FIG. 3C shows a side view of a processor for use with an LS socket, according to one embodiment.

DETAILED DESCRIPTION

Figure 1A:
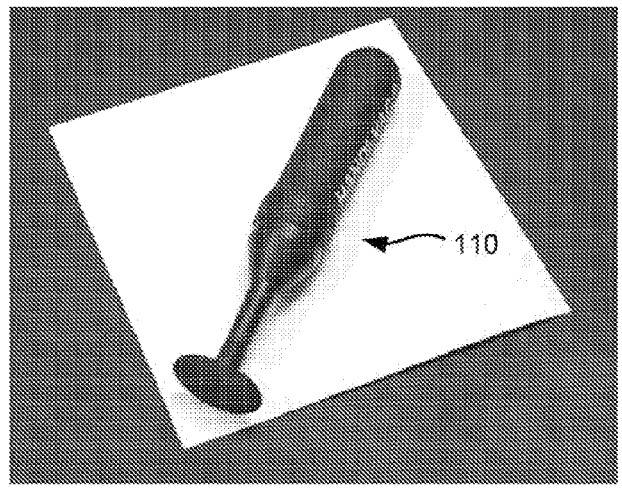
FIGS. 1A-1C illustrate processor pickup tools, according to the prior art.
Figure 1B:
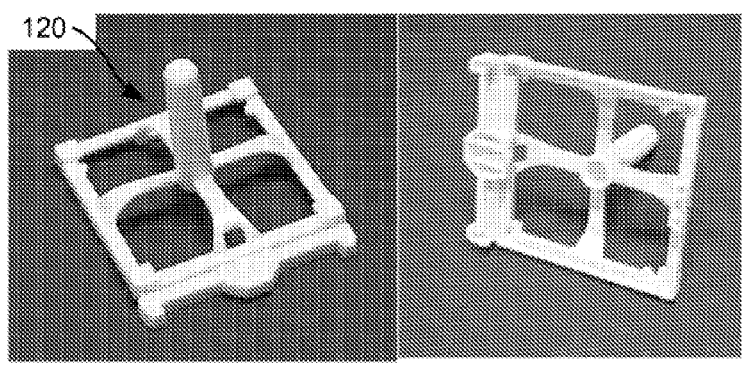
Figure 1C:
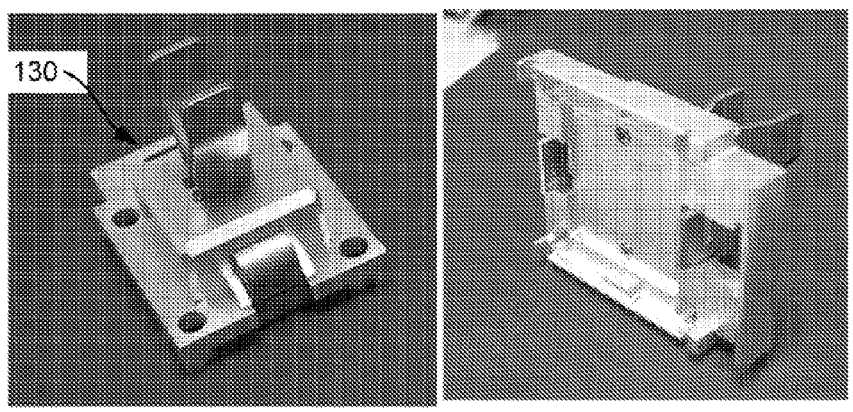

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

According to preferred embodiments, a tool is provided which may be used for manipulating a processor, particularly when lifting the processor up from and/or placing the processor in a socket without damaging the processor and/or the socket. In further embodiments, the tool may be used for shipping the processor, thereby allowing a user to easily seat the processor in a socket without damaging the processor and/or socket.

In one general embodiment, a tool includes an actuating mechanism including a cam plate, at least one gripper member operatively coupled to the cam plate, and a carriage for supporting the at least one gripper member. The at least one gripper member is actuatable by the cam plate. Also, rotation of the cam plate causes the at least one gripper member to move between a first position and a second position, and when the at least one gripper member is in the first position, the tool is able to accept a processor for holding thereof, and when the at least one gripper member is in the second position, the tool securely holds the processor therein.

In another general embodiment, a method for lifting a processor includes aligning a tool with a processor using at least one alignment guide, and operating an actuating mechanism of the tool to lift the processor by rotating a cam plate of the tool. The tool includes the actuating mechanism including the cam plate, at least one gripper member operatively coupled to the cam plate, and a carriage for supporting the at least one gripper member. The carriage includes the at least one alignment guide, and the at least one gripper member is actuatable by the cam plate. Rotation of the cam plate causes the at least one gripper member to move between a first position and a second position, and when the at least one gripper member is in the first position, the tool is able to accept a processor for holding thereof, and when the at least one gripper member is in the second position, the tool securely holds the processor therein.

In another general embodiment, a method for placing a processor includes aligning a tool above a desired placement position using at least one alignment guide, the tool gripping a processor, descending the tool to the desired placement position, and operating an actuating mechanism of the tool to release the processor by rotating a cam plate of the tool. The tool includes the actuating mechanism including the cam plate, at least one gripper member operatively coupled to the cam plate, and a carriage for supporting the at least one gripper member. The carriage includes the at least one alignment guide, and the at least one gripper member is actuatable by the cam plate. Rotation of the cam plate causes the at least one gripper member to move between a first position and a second position, and when the at least one gripper member is in the first position, the tool is able to accept a processor for holding thereof, and when the at least one gripper member is in the second position, the tool securely holds the processor therein.

In yet another general embodiment, a system includes a processor, and a tool holding the processor in a carriage. The tool includes an actuating mechanism including a handle operatively coupled to a cam plate, at least one gripper member operatively coupled to the cam plate, and the carriage for supporting the at least one gripper member. The carriage includes at least one alignment guide for aligning the carriage to a socket, the at least one gripper member is actuatable by the cam plate, and rotation of the cam plate causes the at least one gripper member to move between a first position and a second position. When the at least one gripper member is in the first position, the tool releases the processor, and when the at least one gripper member is in the second position, the tool securely holds the processor therein.

Now referring to FIGS. 2A and 2B, according to one embodiment, a tool 200 for handling a processor (such as for installation and/or removal of the processor into and/or out of a processor socket and/or a processor holder) which minimizes the risk of damaging the processor and/or socket is described. As described in more detail below, the tool 200, according to one of many arrangements, includes keying members that position the processor into the tool. The tool 200 also includes members that key the tool 200 into the socket, to ensure the processor is placed into the socket in the proper orientation. Also, the tool 200 includes a handle 202, which in some embodiments may be used for lifting the tool 200, with or without the processor in place. In addition, the tool 200 includes an actuating mechanism, that serves to lock and/or unlock the processor into/out of the tool 200. This actuating mechanism reduces the risk that the processor will accidentally fall or drop out of the tool 200, thereby eliminating one source of potential damage to the processor and socket. A novel feature of the tool, in this embodiment, is that the action of locking and/or unlocking the processor is unique from an action that is used for handling of the processor, in contrast to conventional tools which use calipers or a "tweezer" action to pick up and place processors. The handle 202 provides a lift point for a user, but in order to lock and/or unlock the processor from the tool, the handle 202, in this embodiment, is rotated relative to the rest of the tool 200.

In one preferred embodiment, a tool 200 includes a handle 202 operatively coupled to an actuating mechanism (a combination of the gripper members 210 and the cam plate 208), a carriage 216 for securing the processor and aligning the tool 200 (and necessarily the processor) with the socket, and a main housing 206 coupled to the carriage 216.

Although not necessarily shown in the individual figures included herein, any individual parts described herein may be incorporated into larger parts encompassing multiple individual parts. Conversely, individual parts described herein may be comprised of several smaller parts. Each individual part described herein is only to be limited by the claims, and not by any descriptions included herein.

As shown in FIG. 2B, according to one embodiment, the main housing 206 may be coupled to the carriage 216 by a number of fastening devices 204 (shown as screws, but not so limited). Possible fastening devices 204 include screws, nails, rivets, glue, solder, friction connections, etc. Also, the handle 202 may be operatively coupled to the actuating mechanism (208, 210) via a fastening device 212. In more approaches, the handle and the cam plate 208 may be formed of a single part, such as through stamping, molding, extruding, etc.

The main housing 206 and the handle 202 may, in some approaches, be integrated together, as long as the action of lifting the tool 200 does not coincide with any portion of the action of securing and/or releasing the processor from the tool 200.

In more approaches, although two gripper members 210 are shown in FIG. 2A, more or less gripper members may be used, such as one continuous gripper member, four gripper members (one for each side of a rectangular processor), etc.

According to some embodiments, the gripper members 210 are actuated by the cam plate 208, such that when the cam plate 208 is rotated into an "open" (first) position, the gripper members are spread apart allowing them to pass outside of the exterior dimensions of a processor. Conversely, when the cam plate 208 is rotated into a "closed" (second) position, the gripper members 210 are positioned closer together than when in the "open" position, thereby securing the processor into the carriage 216. In one preferred embodiment, the handle 202, which is coupled to the cam plate 208, is rotatable such that rotating the handle 202 causes the cam plate 208 to rotate, thereby actuating the gripper members 210 between a first position and a second position.

The cam plate 208, in one approach, includes two slots which accept a portion of the gripper members 210 for actuation thereof, and which have slightly inward rotational axis changes that cause the gripper members 210 to move in linear directions as the cam plate 208 is rotated. In some approaches, the handle 202 and cam plate 208 may rotate 45° to actuate the gripper members 210, alternatively 90°, 135°, 180°, etc. Of course, any rotational amount may be used to actuate the tool 200, as long as it can be performed by a user without damaging the processor.

In some approaches, the cam plate 208 may be comprised of a material which provides low friction movement and rotation, along with reliable service life and jitter-free operation. A material which resists stiction is preferred, and some examples include viton, polytetrafluoroethylene (PTFE), perfluoroalkoxy polymer resin (PFA), fluorinated ethylene-propylene (FEP), other fluoropolymer, thermoplastic, etc. Of course, other materials may also be used, such as magnesium, aluminum, copper, brass, steel, etc. Also, composites, combinations, and/or alloys of several materials may also be used.

In some embodiments, the gripper members 210, or a portion thereof that contacts the processor when the tool 200 is in a "closed" position, may be comprised of a deformable material, such as polycarbonate, rubber, plastic, etc., as long as the material provides rigidity to hold the processor in place when the gripper members 210 are in the "closed" position, but also flexible such that slight tolerance differences do not cause the processor to be damaged while held in place by the gripper members 210. In one embodiment, the gripper members 210 are positioned such that when in the "closed" position, they exert a small amount of pressure on the exterior edge surfaces of the processor to hold it in place in the carriage 216. In one example, the gripper members 210 may be flexible enough that movements of the tool 200 do not cause the processor to eject from the carriage 216. In more embodiments, the gripper members 210 may include spring-loaded members, which may provide a consistent pressure on the exterior surfaces of the processor edges.

Preferably, the gripper members 210 may include a lip near the lower portion such that the lip, when the gripper members 210 are engaged against the processor while the tool 200 is in the "closed" position, will urge the processor in an upward direction, away from the socket and into the carriage 216. See, e.g., FIGS. 8A-8C.

Referring again to FIGS. 2A-2B, according to some embodiments, the carriage 216 and gripper members 210 are oriented to fit with an LS socket design. In other approaches, the carriage 216 and gripper members 210 are oriented to fit with other socket designs, such as socket B, socket T, socket H, etc. In some preferred embodiments, the carriage 216 may be arranged such that it does not disturb thermal interface material on a grease surface of the processor being held by the tool 200.

Generally, a layer of thermal interface material (TIM) is positioned between the processor and a processor heatsink. The TIM is a thermal grease applied to the heatsink on the surface that contacts the processor. This TIM provides for a proper thermal bond between the heatsink and the processor.

If a processor is installed in a socket, and needs to be removed, the heatsink may be removed first if it is not coupled to the processor. After removal of the heatsink, a layer of TIM is present on both the upper surface of the processor (grease surface) and the lower surface of the heatsink. Therefore, so as not to disturb the thermal interface material on this grease surface or any TIM present thereon, a TIM grease pocket may be provided on the carriage 216. The purpose of the grease pocket in the carriage 216 is so that the processor can be removed from the system after heatsink installation.

For example, in some manufacturing environments, it may be necessary to reseat the processor. Upon removal of the processor heatsink from the processor, a TIM residue may remain on both the heatsink and the grease surface of the processor. The TIM grease pocket on the carriage 216 allows for this process to be done without disturbing the thermal interface material on the grease surface of the processor which allows for a reseating of the original heatsink. This avoids having to reapply TIM grease to the heatsink or having to replace the heatsink in order to attain a proper thermal bond between the heatsink and the processor.

Some examples of TIM include Shin-Etsu 7783D, Bergquist 225U, and Honeywell PCM45F. Shin-Etsu has a corporate office at 6-1, Ohtemachi 2-chome, Chiyoda-ku, Tokyo 100-0004, Japan. Bergquist has a corporate office at 18930 W. 78th St., Chanhassen, Minn. 55317, USA. Honeywell has a corporate office at 3500 Garrett Dr., Santa Clara, Calif. 95054, USA.

In some embodiments, the carriage 216, or any other part of the tool 200, may include an alignment guide 218 for aligning the tool 200 with a socket, ensuring proper placement of the processor into the socket, and proper placement of the tool 200 over a processor for removal of the processor from the socket. As shown in FIG. 2B, the tool 200 may include two alignment guides 218, which are designed to interact with features on the socket or circuit board which includes the socket. Any type of alignment guide may be used to properly align the tool 200 with a socket, such as protruding portions of the tool 200 which align with slots or holes of the socket and/or circuit board, marks on the tool 200 which correspond to marks on the circuit board and/or socket, protruding portions of the socket and/or circuit board which align with holes in the tool 200, etc. Preferably, but in no way limiting, the alignment guides provide for positive engagement when properly aligned, such that a user does not mistakenly think the parts are aligned when they are not.

In some approaches, the main housing 206 may be comprised of a rigid material that provides support to the handle 202 and provides a channel for the handle 202 to extend through, thereby coupling with the cam plate 208 in a fashion that allows the handle 202 and cam plate 208 to be actuated independently from the rest of the tool 200. As shown in FIG. 2B, the main housing 206 also includes fins that extend radially from the channel, but is not so limited. Any design of the main housing 206 which would provide suitable support to the handle 202 and allow for independent actuation of the cam plate 208 and handle 202 may be used.

Also, as shown in FIG. 2B, the main housing 206 may include an indicator 214 which may provide guidance for a user as to which rotational direction opens (first position of the gripper members 210) and closes (second position of the gripper members 210) the tool 200. This indicator 214 may also include an indication of the tool's current position, such as a portion of the handle 202 which protrudes beyond the main housing 206, like a pointer on a scale.

With continued reference to FIG. 2B, a tool 200, according to one embodiment, includes an actuating mechanism including a cam plate 208, at least one gripper member 210 operatively coupled to the cam plate 208, and a carriage 216 for supporting the at least one gripper member 210. The carriage 216 includes at least one alignment guide 218 for aligning the carriage 216 to a socket (not shown). Also, the at least one gripper member 210 is actuatable by the cam plate 208, and rotation of the cam plate 208 causes the at least one gripper member 210 to move between a first position and a second position. When the at least one gripper member 210 is in the first position, the tool 200 is able to accept a processor (not shown) for holding thereof, and when the at least one gripper member 210 is in the second position, the tool 200 securely holds the processor therein.

In one embodiment, the actuating mechanism may further comprise a handle 202 operatively coupled to the cam plate 208. In a further embodiment, the handle 202 may be operatively coupled to the actuating mechanism via at least one fastening device. As shown in FIG. 2B, they are coupled by a screw 212, but any fastening device may be used.

Figure 7:
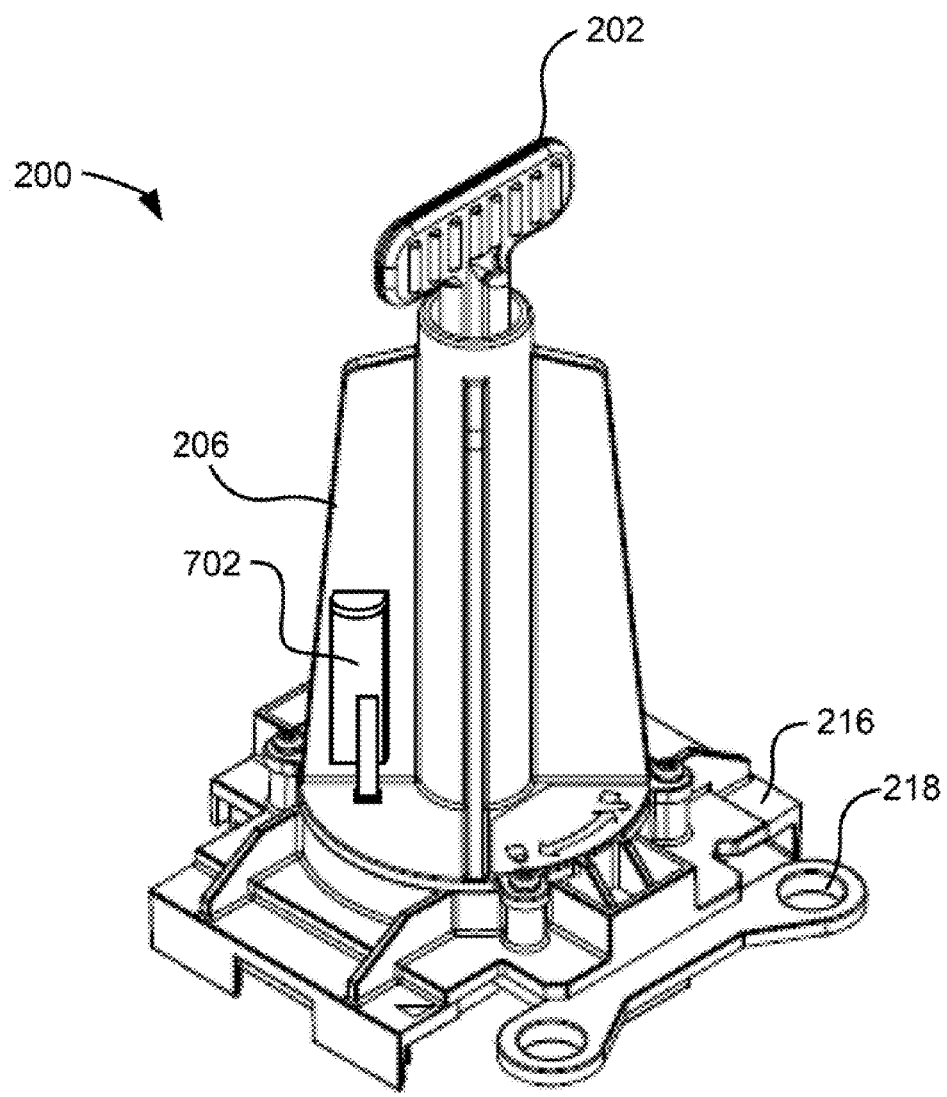
FIG. 7 shows an isometric views of a tool including a locking mechanism, according to several embodiments.

Referring to FIG. 7, the tool 200 may include a locking mechanism 702 that operatively resists movement from a desired position of at least one of: the cam plate (208, FIG. 2B), the at least one gripper member 210, and the handle 202. For example, a portion of the locking mechanism 702 may be positionable such that in one position, it extends through the main housing 206 and engages the cam plate such that it cannot move from a current position. In doing so, the gripper members are also restricted in movement, since they are operatively coupled to the cam plate. In this way, the tool 200 may be locked into a desired position, such that a processor being gripped by the tool 200 cannot fall out, be jarred out, or be damaged by movement of the tool 200.

In one approach, referring again to FIGS. 2A-2B, the tool 200 includes a main housing 206 coupled to the carriage 216 which might provide support for at least a portion of the actuating mechanism.

In more approaches, at least one second alignment guide is included for aligning the carriage 216 with the processor (not shown). In other approaches, the actuating mechanism may have a feature that restricts movement of the at least one gripper member 210 when the at least one gripper member 210 is in a desired position, such as the first or second position, or any other position available. For example, as shown in FIG. 4A, the cam plate 208 may include a slot 402 which has a notch 404 that restricts movement of the at least one gripper member 210 when it is in an end position.

In one embodiment, the feature is at least one notch 404 in a slot 402 of the cam plate 208 which corresponds with the at least one gripper member 210 being in the second position.

In another embodiment, referring again to FIG. 2B, the main housing 206 may be coupled to the carriage 216 via at least one fastening device, such as a screw as shown.

Figure 8A:
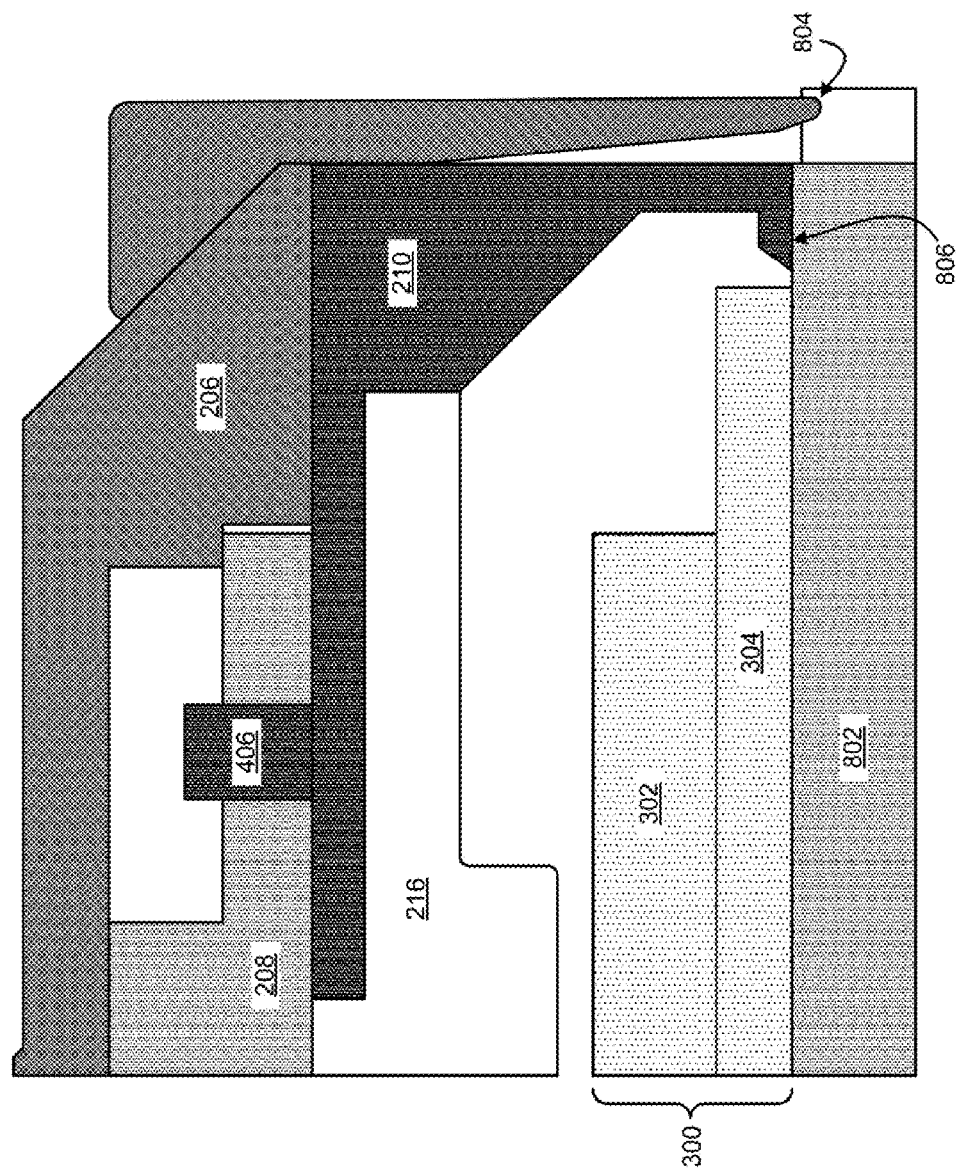
FIGS. 8A-8C show a portion of a tool, according to several embodiments.
Figure 8B:
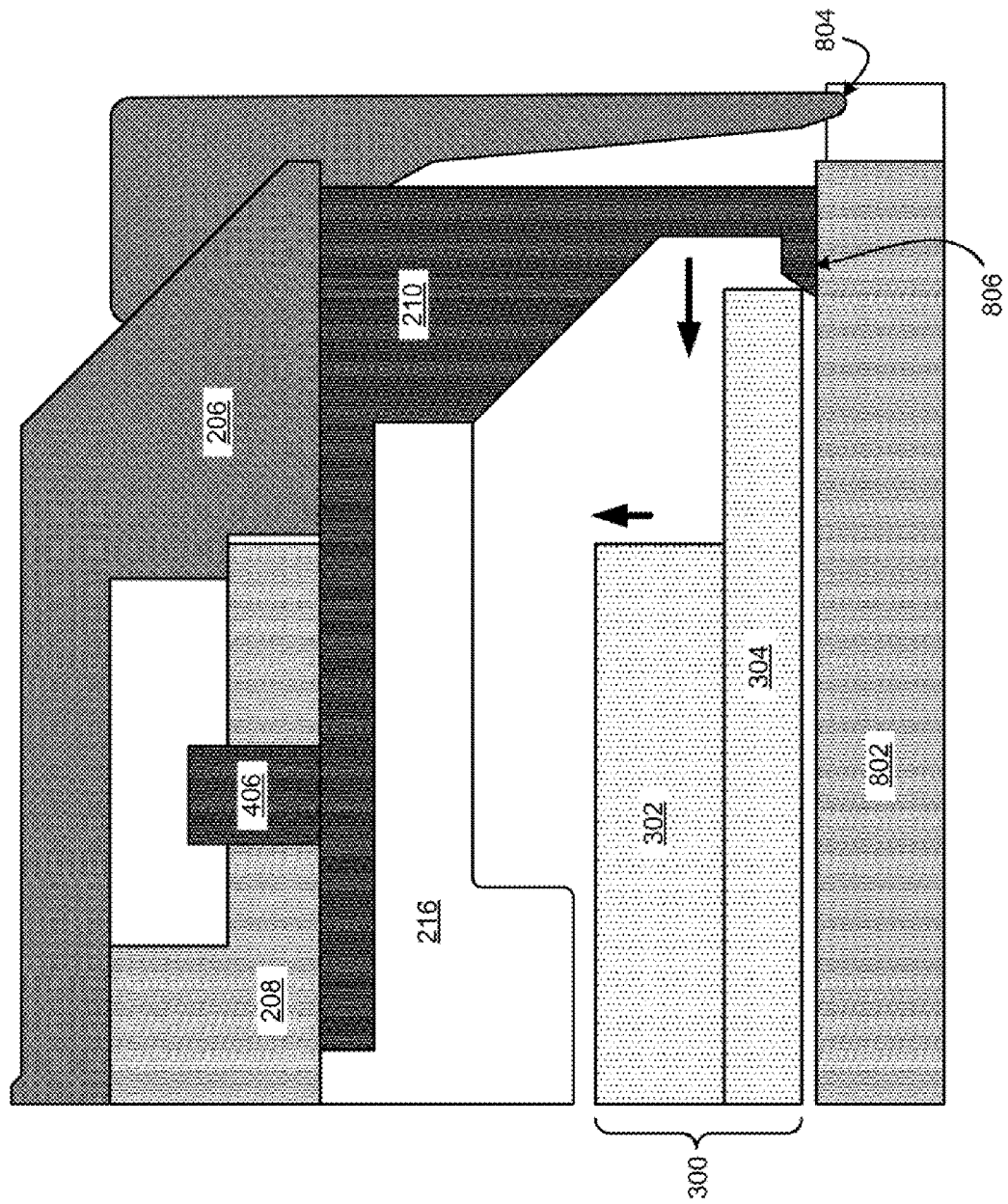
Figure 8C:
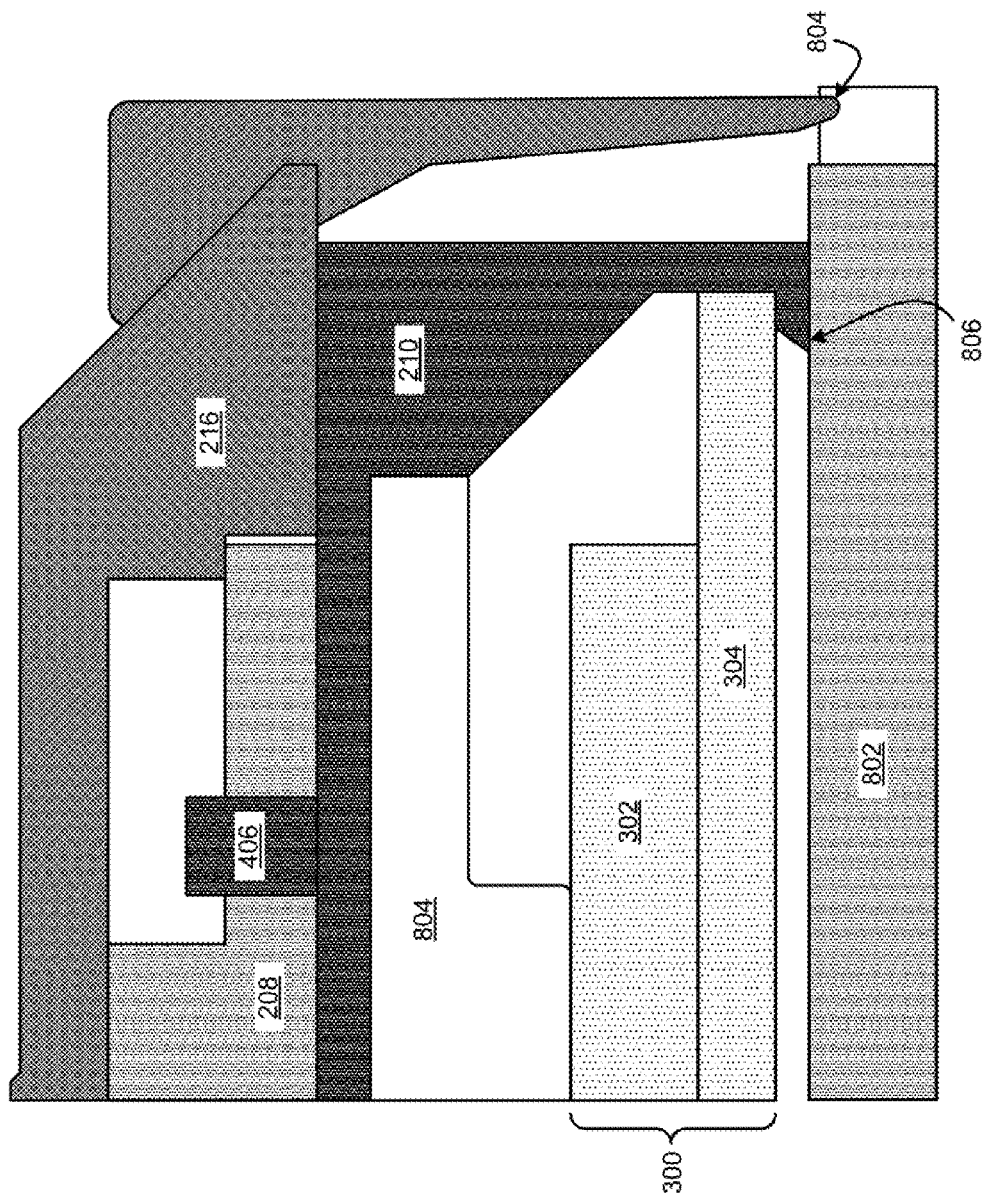

In another embodiment, as shown in FIGS. 8A-8C, a portion 806 of the at least one gripper member 210 may contact the processor 300 when the processor is positioned in the carriage 216. A portion of the at least one gripper member 210 that contacts the processor 300 may be comprised of a deformable material, such as rubber, plastic, etc.

In some approaches, the at least one gripper member 210 includes a lip portion 806 that urges the processor 300 in an upward direction when the at least one gripper member 210 is moved towards the second position from the first position, as shown progressively in FIGS. 8A-8C.

In a particularly preferred embodiment, the carriage 216 may be arranged such that it can accept a processor designed for use with an LS socket.

Now referring to FIGS. 3A-3C, an illustrative processor 300 of a type to be manipulated with the tool (200, FIG. 2A) is shown according to one embodiment. With continued reference to FIG. 3A, an isometric view of the processor is shown 300. It can be seen that this processor 300 includes an elevated or raised portion 302 which is generally used to dissipate heat (e.g., a heatsink or heatspreader) above a wider, socket engaging portion 304, which is generally a main processor card. In some embodiments, the tool (200, FIG. 2B) may include gripper members 210 designed to engage the raised portion (302, FIG. 3A). In other embodiments, the tool (200, FIG. 2B) may include gripper members 210 designed to engage the wider portion (304, FIG. 3A).

With reference to FIG. 3B, a top view of the processor 300 is shown, including some dimensions the processor 300 as they would be if the processor was designed for use with an LS socket. All dimensions are reported in millimeters (mm). Of course, a tool may be designed for use with processors designed for use with other sockets, such as socket B, socket T, socket H, etc. The dimensions for these sockets are not shown since they are known in the art.

Referring to FIG. 3C, a side view of the processor 300 is shown along with dimensions typical of a processor designed for use with an LS socket. These dimensions are for reference only, and are included to represent the dimensions that a carriage would be designed to accommodate, if an LS socket is being used with the tool.

Figure 4B:
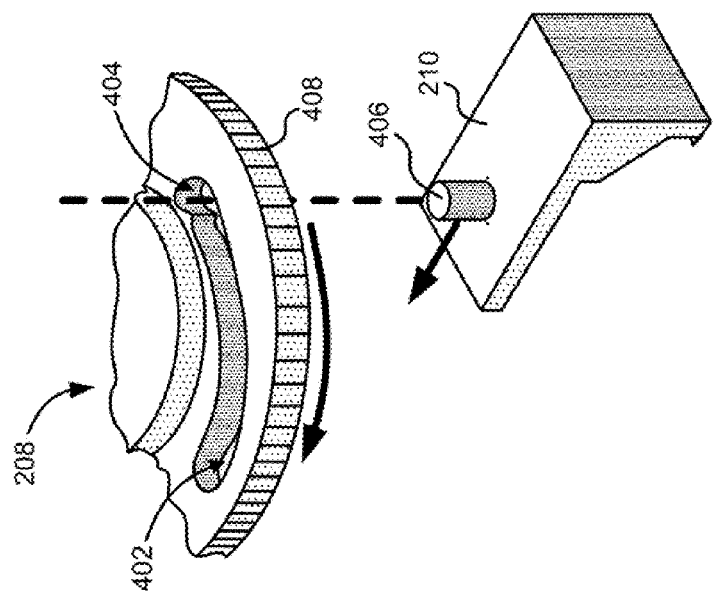
FIG. 4B shows a close-up view of a portion of a cam plate from circle 4 in FIG. 2B, according to one embodiment.
Figure 4A:
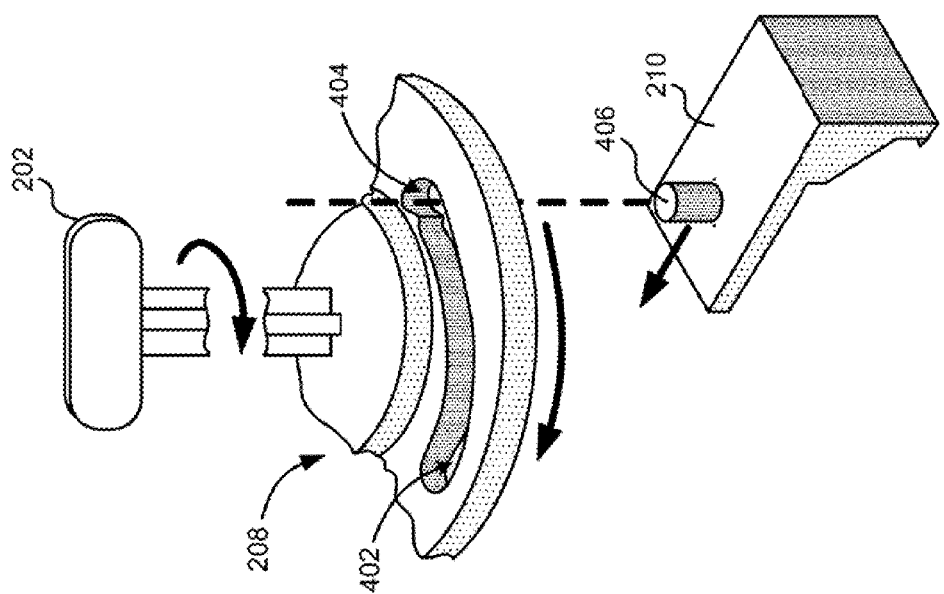
FIG. 4A shows a close-up view of a portion of a cam plate from circle 4 in FIG. 2B, according to one embodiment.

With reference to FIGS. 4A and 4B, some preferred embodiments of the actuating mechanism are described. In one embodiment, the cam plate 208 may include a slot 402 which is directed inward, such that as the cam plate 208 is rotated, the post 406 of the gripper member 210 is forced inward as well, thereby moving the gripper member 210. In further embodiment, the gripper member 210 is positioned in a track or slot, such that it can move in a linear direction only. In one approach, this rotational force may be applied to a handle 202, as shown in FIG. 4A. In another approach, the rotational force may be applied to the cam plate 208 through use of direct force on an exterior surface of the cam plate 208, such as a gripping surface 408, as shown in FIG. 4B. Of course, any other mechanism or method may be used to rotate the cam plate 208 in addition to or in place of any of the mechanisms and/or methods described herein.

According to some embodiments, a notch 404 may be included in the slot 402, such that when the post 406 is in a position corresponding to the gripper member 210 being in a desired position, such as with the gripper member 210 extended linearly as far as possible in either direction. Any other mechanism or method may be used to secure movement of the cam plate 208, gripper member 210, or any other component of the tool.

Figure 10A:
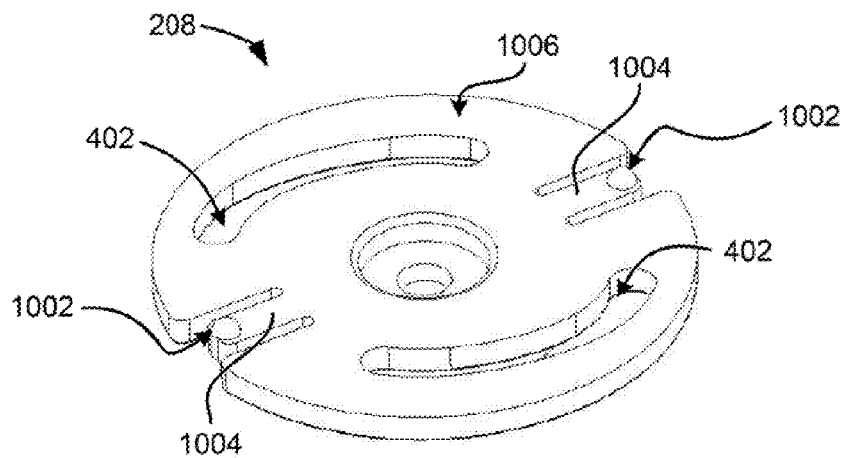
FIG. 10A shows an underside of a cam plate, according to one embodiment.
Figure 10B:
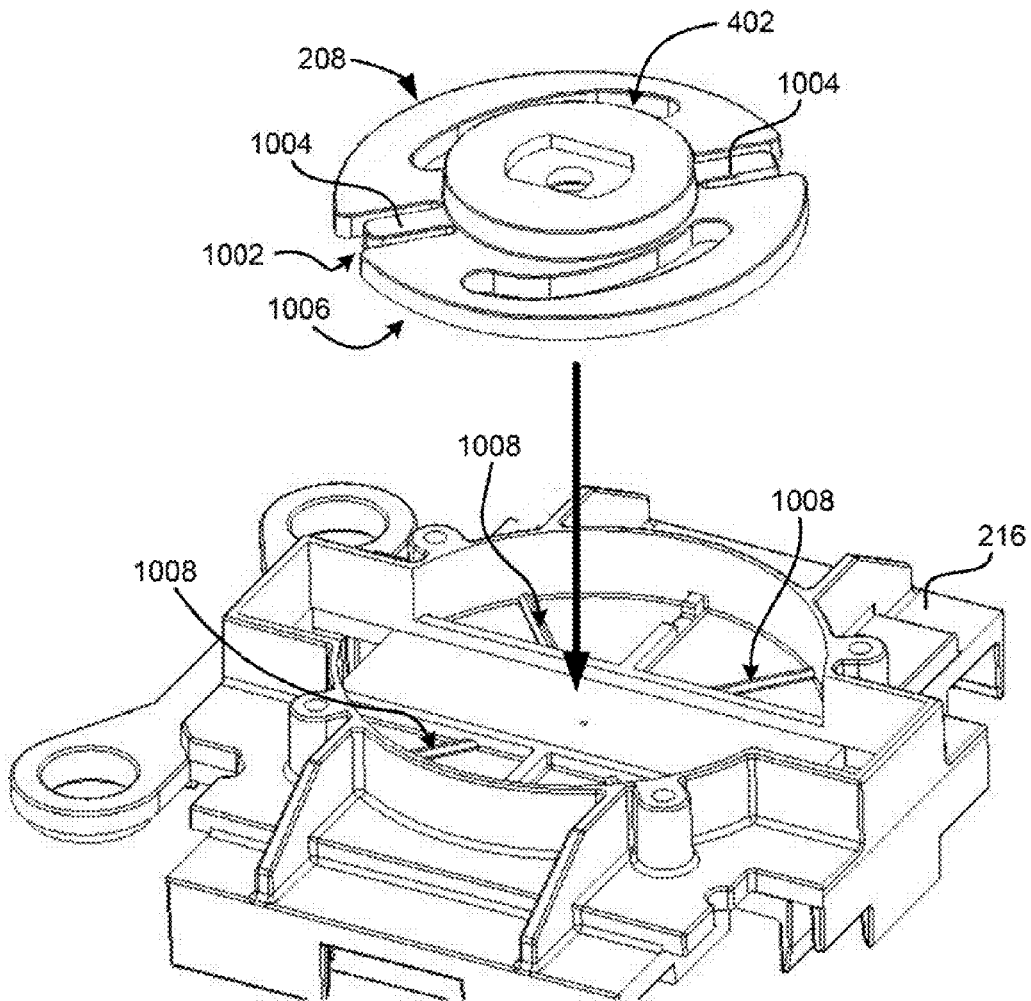
FIG. 10B illustrates engagement of the cam plate with the carriage, according to one embodiment.

Referring to FIGS. 10A-10B, in another embodiment, a cam plate 208 with rotational stops is shown, along with a carriage 216 designed to function with the cam plate 208 shown in FIG. 10A. In FIG. 10A, an underside 1006 of the cam plate 208 is shown, in one approach. As can be seen from this view, the cam plate 208 may include slots 402 for engaging a portion of the gripper member (not shown) and at least one flex beam 1004 coupled to a detent bump 1002. As shown in FIG. 10A, there are two detent bumps 1002 coupled to two flex beams 1004. The one or more detent bumps 1002 may be spherical (as shown), conical, pyramidal, etc., in shape, and may be formed as part of the flex beam 1004 from which it is coupled.

Now referring to FIG. 10B, the cam plate 208, with the underside 1006 facing toward the carriage 216, is engaged as shown by the downward arrow. The carriage 216 may include one or more detent ribs 1008 which engage the detent bumps 1002 on the cam plate 208. As the detent bumps pass along the detent ribs 1008, the flex beam 1004 flexes, allowing the detent bump 1002 to move upward and pass by the detent rib 1008 when more rotational force is exerted on the cam plate 208. The detent ribs 1008, in one embodiment, include two members, with a gap between the members which is large enough to allow a portion of the detent bump 1002 to protrude slightly down between the members, thereby providing resistance to rotational movement of the cam plate 208 once the detent bumps 1002 are engaged with the detent ribs 1008, e.g., the detent bump 1002 is seated between the members of the detent rib 1008. As shown in FIG. 10B, there are four detent ribs 1008, which provide two resistance positions (e.g., positions relating to the gripper members being open and closed). Any number of detent ribs 1008 may be provided, relating to the number of rotational stops desired.

As shown in FIGS. 4A-4B and 10A-10B, two embodiments that provide rotational resistance to the cam plate 208 are shown. However, other embodiments which also provide rotational resistance to the cam plate 208 or any other member coupled to the cam plate 208, such as the handle, gripper member, etc., may be used to provide these rotational stops.

Figure 5:
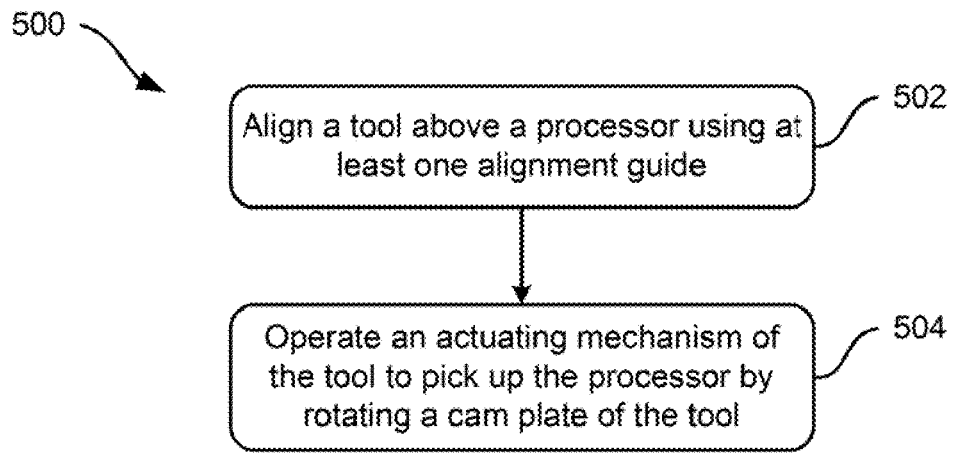
FIG. 5 shows a method for lifting a processor, according to one embodiment.

Now, with reference to FIG. 5, a method 500 for lifting a processor is described according to one embodiment. The method 500 may be performed in any desired environment, and may include more operations not described herein.

In operation 502, a tool is aligned with a processor using at least one alignment guide. This alignment assures that the processor, socket, and/or tool are not damaged during removal of the processor.

In operation 504, an actuating mechanism of the tool is operated to lift the processor by rotating a cam plate of the tool. The tool comprises the actuating mechanism including the cam plate, at least one gripper member operatively coupled to the cam plate, and a carriage for supporting the at least one gripper member. The carriage includes the at least one alignment guide, and the at least one gripper member is actuatable by the cam plate. Also, rotation of the cam plate causes the at least one gripper member to move between a first position and a second position. Furthermore, when the at least one gripper member is in the first position, the tool is able to accept a processor for holding thereof, and when the at least one gripper member is in the second position, the tool securely holds the processor therein.

According to one approach, the at least one gripper member may include a lip portion that urges the processor in an upward direction when the at least one gripper member is moved towards the second position from the first position.

In another approach, the carriage may be arranged such that it can accept a processor designed for use with an LS socket.

Figure 6:
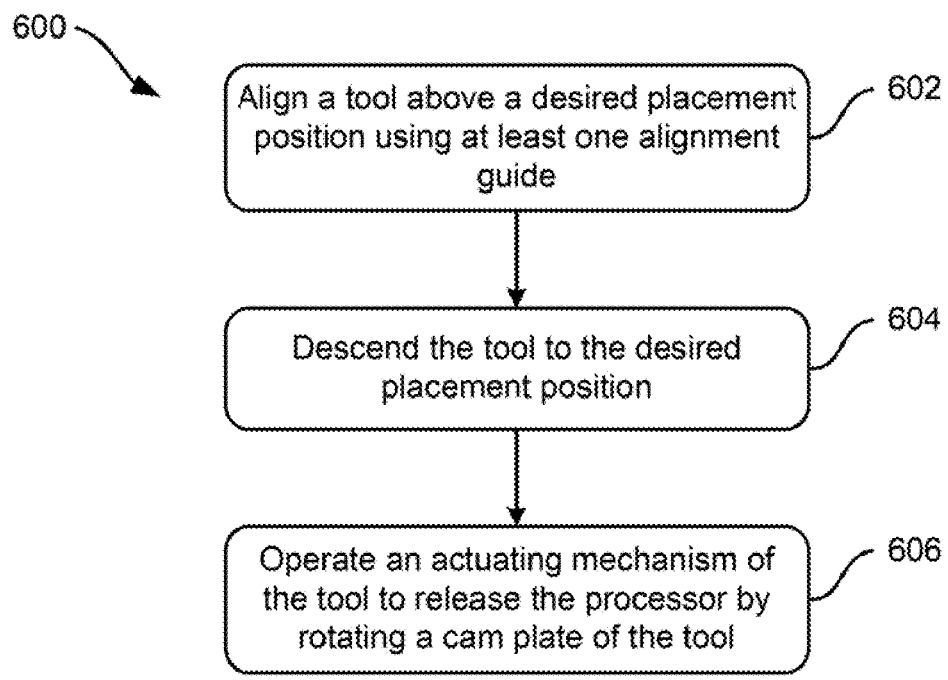
FIG. 6 shows a method for placing a processor, according to one embodiment.

Now referring to FIG. 6, a method 600 for placing a processor is shown according to one embodiment. The method 600 may be performed in any desired environment, and may include more operations not described herein.

In operation 602, a tool is aligned above a desired placement position using at least one alignment guide, the tool gripping a processor. This alignment assures that the processor, socket, and/or tool are not damaged during installation of the processor.

In operation 604, the tool is descended to the desired placement position. The tool should stay aligned with the processor and/or socket during the descending.

In operation 606, an actuating mechanism of the tool is operated to release the processor by rotating a cam plate of the tool. The tool comprises the actuating mechanism including the cam plate, at least one gripper member operatively coupled to the cam plate, and a carriage for supporting the at least one gripper member. The carriage includes the at least one alignment guide, and the at least one gripper member is actuatable by the cam plate. Also, rotation of the cam plate causes the at least one gripper member to move between a first position and a second position. Furthermore, when the at least one gripper member is in the first position, the tool is able to accept a processor for holding thereof, and when the at least one gripper member is in the second position, the tool securely holds the processor therein.

According to one approach, the at least one gripper member may include a lip portion that urges the processor in an upward direction when the at least one gripper member is moved towards the second position from the first position.

In another approach, the carriage may be arranged such that it can accept a processor designed for use with an LS socket.

Now referring to FIGS. 8A-8C, some additional approaches are described which illustrate movement of the actuating member, according to one embodiment. In FIG. 8A, a side view of a portion of an actuating mechanism is shown, according to one embodiment. The gripper member 210 includes a post 406, which is operatively coupled to a cam plate 208, in one approach. The tool also includes a main housing 206, which may include a portion which can be used to align the tool with the socket 802, such as an alignment guide 804. In FIGS. 8A-8C, the alignment guide 804 is a locating wall.

The tool also includes a carriage 216 which the processor 300 presses up against when being held by the tool. Also, the gripper member 210 includes a portion 806 which urges the processor 300 upward when the gripper member 210 is moved from a position allowing the processor 300 to move in and out of the tool to a position where the processor 300 is being held.

As shown progressively in FIGS. 8A to 8C, as the gripper member 210 is moved inward, the portion 806 of the gripper member 210 engages a portion 304 of the processor 300 and lifts it upward into the carriage 216 of the tool. Although the processor 300 is shown in a socket 802, it may also be lifted from a holder, tabletop, or any other surface. In order to release the processor 300, the gripper member 210 is moved outward, thereby allowing the processor 300 to be released from the carriage 216.

According to one embodiment, a system includes a processor, and a tool holding a processor in a carriage. This system may be used for shipping of the processor, such that when it is received by a user, it can be installed easily without exposing the processor and/or socket to potential damage. In one preferred embodiment, a locking mechanism may be included that operatively resists movement from a desired position of at least one of: the cam plate, the at least one gripper member, and the handle of the tool holding the processor.

Figure 9A:
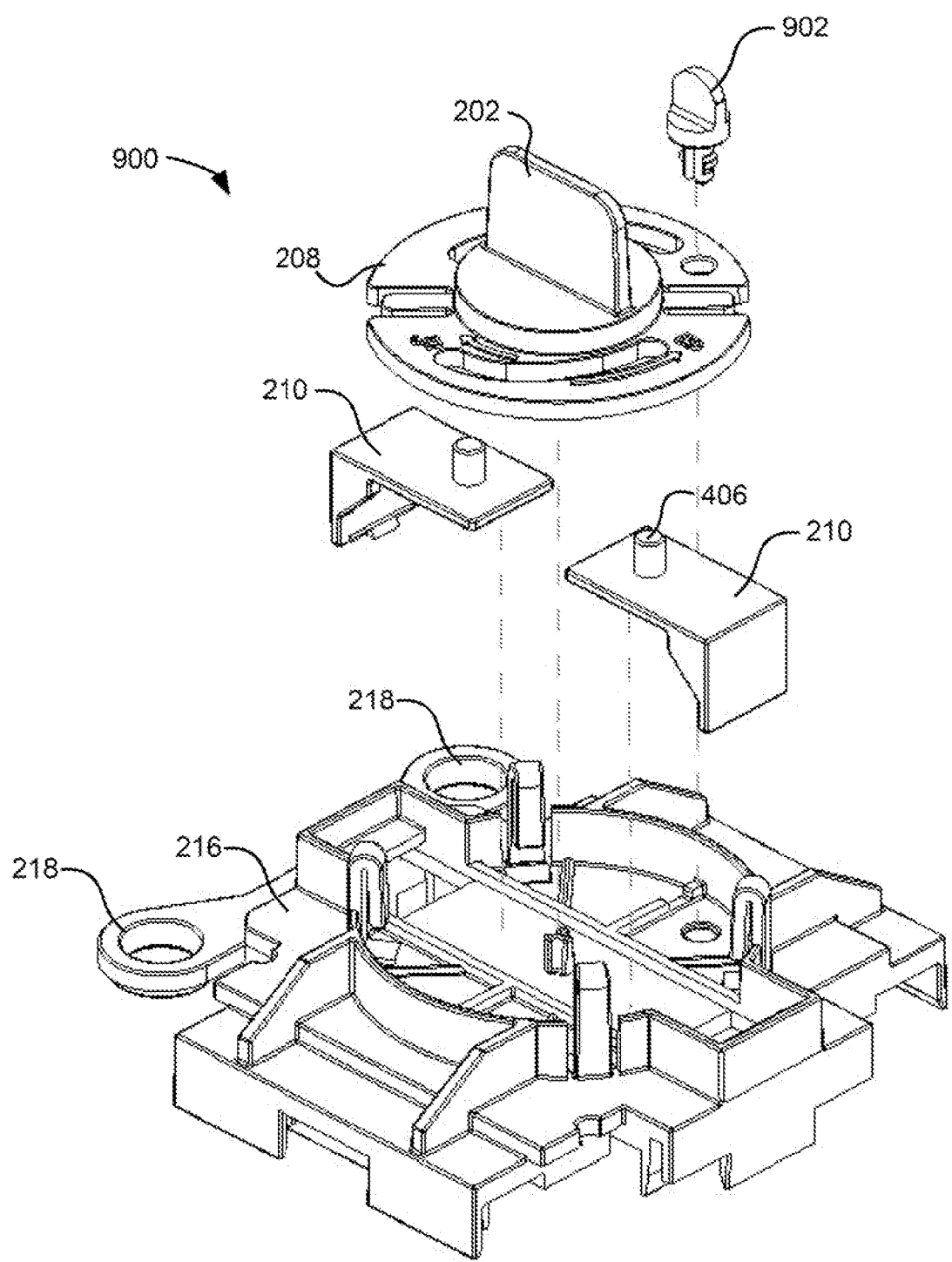
FIGS. 9A-9C show various views of a tool, according to one embodiment.
Figure 9B:
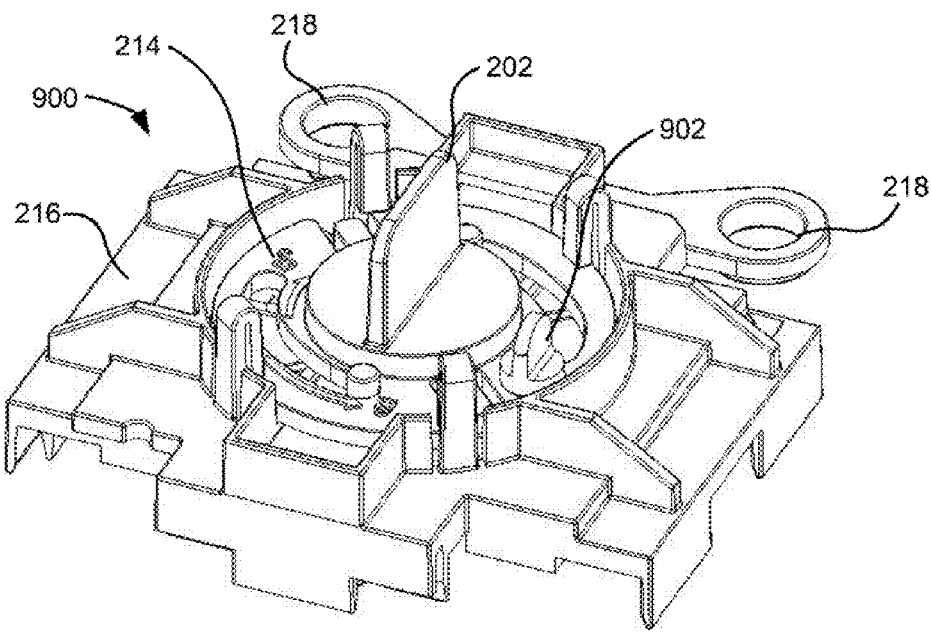
Figure 9C:
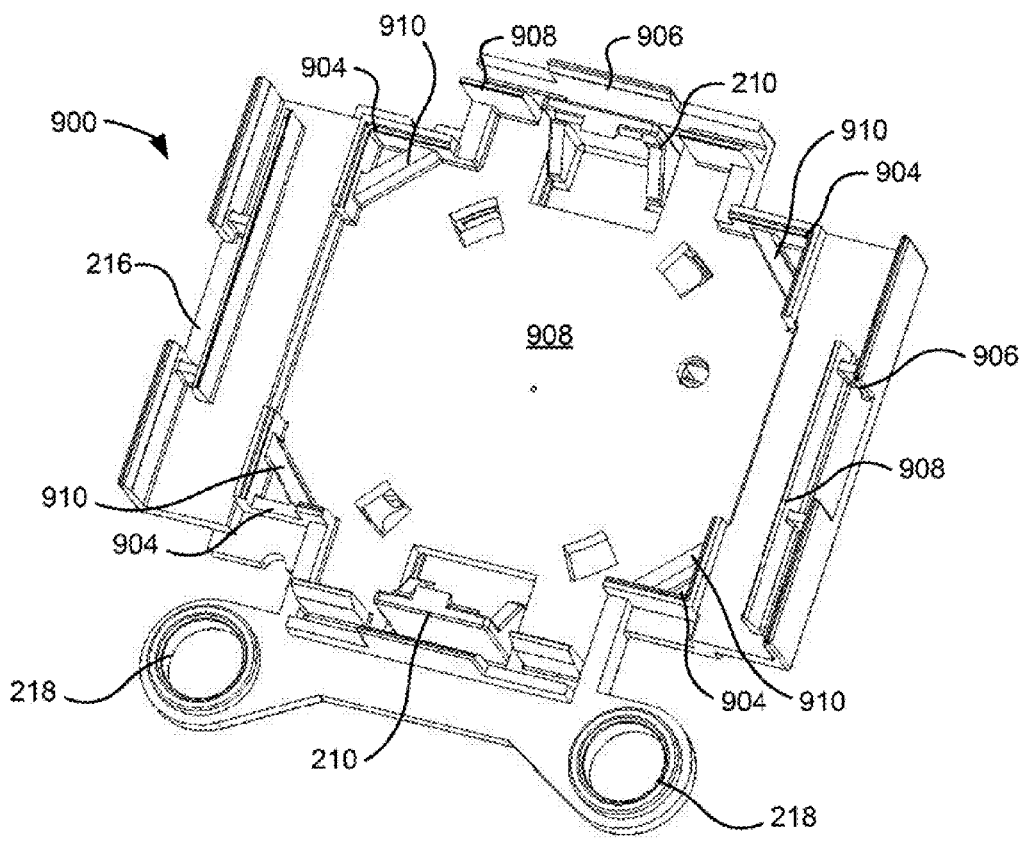

Now referring to FIGS. 9A-9C, several views of a tool 900 are shown, according to one embodiment. As shown in FIG. 9A, an exploded view of the tool 900, the handle 202 may, in some approaches, be coupled to the cam plate 208, which is supported by the carriage 216, thereby providing a tool 900 which lacks a main housing. Gripper members 210 may be actuated by the cam plate 208, and a fastening member 902 may secure the cam plate 208 to a rotating element in the carriage 216. Alignment guides 218 may also be present on the tool 900, and function as previously described.

Now referring to FIG. 9B, an isometric view of the tool 900, it can be seen that an indicator 214 may provide guidance for a user as to which rotational direction opens (first position of the gripper members 210) and closes (second position of the gripper members 210) the tool 200. Also, it can be seen that this embodiment provides for a less expensive and more compact design, suitable for shipping the tool 900 with a processor.

In FIG. 9C, an underside view of the tool 900 is shown according to one embodiment. According to several embodiments, alignment guides 218 may be used to align features on an independent loading mechanism (ILM), and location/alignment features 906 located on the underside of the carriage may be used to align the tool 900 to the processor socket. According to additional embodiments, corner alignment features 904 may be used to provide proper location of a heatspreader on the processor, and processor substrate locators 908 may ensure proper positioning of the substrate to ensure proper installation of the processor into the tool 900. Of course, other alignment features may be provided in lieu of or in addition to those described above.

In more approaches, stop features 910 may rest above a surface of the heatspreader of a processor when seated in the tool 900. These features may restrict upward movement of the processor when seated. In other approaches, a recessed pocket 908 may be provided that allows for clearance for heatsink grease, such that lifting/reseating a processor does not damage a grease surface of a heatsink. Other approaches may also be used to avoid damaging the grease provided with a heatsink of a processor.

Also, systems may implement and include additional embodiments and approaches not specifically described herein, but would be apparent to one of skill in the art, without departing from the scope of the invention.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A tool comprising:
an actuating mechanism including a cam plate;
at least one gripper member operatively coupled to the cam plate; and
a carriage for supporting the at least one gripper member, wherein the at least one gripper member is actuatable by the cam plate,
wherein parallel rotation of the cam plate relative to a processor causes the at least one gripper member to move between a first position and a second position,
wherein when the at least one gripper member is in the first position, the tool is able to accept the processor for holding thereof, and
wherein when the at least one gripper member is in the second position, the tool securely holds the processor therein.

2. The tool as recited in claim 1, wherein the actuating mechanism further comprises a handle operatively coupled to the cam plate.

3. The tool as recited in claim 2, wherein the handle is operatively coupled to the actuating mechanism via at least one fastening device.

4. The tool as recited in claim 1, further comprising a locking mechanism that operatively resists movement from a desired position of at least one of: the cam plate, the at least one gripper member, and the handle.

5. The tool as recited in claim 1, further comprising a main housing coupled to the carriage which provides support for at least a portion of the actuating mechanism.

6. The tool as recited in claim 1, further comprising at least one aligmnent guide for at least one of: aligning the carriage to a socket, and aligning the carriage with the processor.

7. The tool as recited in claim 1, wherein the actuating mechanism has a feature that restricts movement of the at least one gripper member when the at least one gripper member is in a desired position.

8. The tool as recited in claim 7, wherein the feature is at least one notch in a slot of the cam plate which corresponds with the at least one gripper member being in the second position.

9. The tool as recited in claim 1, wherein the main housing is coupled to the carriage via at least one fastening device.

10. The tool as recited in claim 1, wherein a portion of the at least one gripper member contacts the processor when the processor is positioned in the carriage, wherein the portion of the at least one gripper member that contacts the processor is comprised of a deformable material.

11. The tool as recited in claim 1, wherein the at least one gripper member includes a lip portion that urges the processor in an upward direction when the at least one gripper member is moved towards the second position from the first position.

12. The tool as recited in claim 1, wherein the carriage is arranged such that it can accept a processor designed for use with an LS socket without disturbing a thermal interface material on a grease surface of the processor.

* * * * *